United States Patent
Yoo

(10) Patent No.: US 11,289,341 B2
(45) Date of Patent: Mar. 29, 2022

(54) PATTERN TRANSFER TECHNIQUE AND METHOD OF MANUFACTURING THE SAME

(71) Applicant: Taiwan Semiconductor Manufacturing Co., Ltd., Hsin-Chu (TW)

(72) Inventor: Chue San Yoo, Hsin-Chu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 262 days.

(21) Appl. No.: 16/587,335

(22) Filed: Sep. 30, 2019

(65) Prior Publication Data

US 2020/0027747 A1    Jan. 23, 2020

Related U.S. Application Data

(63) Continuation of application No. 15/194,631, filed on Jun. 28, 2016, now Pat. No. 10,490,414.

(51) Int. Cl.
| | |
|---|---|
| H01L 21/00 | (2006.01) |
| H01L 21/311 | (2006.01) |
| H01L 23/544 | (2006.01) |
| H01L 21/67 | (2006.01) |
| H01L 21/68 | (2006.01) |
| H01J 37/32 | (2006.01) |

(52) U.S. Cl.
CPC .. *H01L 21/31144* (2013.01); *H01J 37/32009* (2013.01); *H01L 21/31116* (2013.01); *H01L 21/67063* (2013.01); *H01L 21/67069* (2013.01); *H01L 21/681* (2013.01); *H01L 23/544* (2013.01); *H01J 2237/334* (2013.01); *H01L 2223/54426* (2013.01)

(58) Field of Classification Search
CPC ......... H01L 21/31144; H01L 21/31116; H01L 21/67063; H01L 21/67069; H01L 21/681; H01L 23/544; H01L 2223/54426; H01J 37/32009; H01J 2237/334; G03F 7/12
See application file for complete search history.

(56) References Cited

U.S. PATENT DOCUMENTS

| | | |
|---|---|---|
| 5,236,118 A | 8/1993 | Bower et al. |
| 5,503,704 A | 4/1996 | Bower et al. |

(Continued)

OTHER PUBLICATIONS

Wang, Wei-Chih. "Moire Interferometry." Department of Mechanical Engineering University of Washington. Published May 18, 2005.

(Continued)

*Primary Examiner* — Mounir S Amer
*Assistant Examiner* — Alexander Belousov
(74) *Attorney, Agent, or Firm* — Eschweiler & Potashnik, LLC

(57) ABSTRACT

A photo-free lithography process with low cost, high throughput, and high reliability is provided. A template mask is bonded to a production workpiece and comprises a plurality of openings defining a pattern. An etch is performed into the production workpiece, through the plurality of openings, to transfer the pattern of the template mask to the production workpiece. The template mask is de-bonded from the production workpiece. A system for performing the photo-free lithography process is also provided.

20 Claims, 7 Drawing Sheets

(56) References Cited

U.S. PATENT DOCUMENTS

| | | |
|---|---|---|
| 7,428,056 B2 | 9/2008 | Freischlad et al. |
| 2005/0239291 A1* | 10/2005 | Alba ................... G03F 7/0015 |
| | | 438/720 |
| 2012/0252221 A1 | 10/2012 | De Brabander et al. |
| 2016/0308020 A1 | 10/2016 | Sreenivasan et al. |
| 2017/0203471 A1 | 7/2017 | Obata et al. |

OTHER PUBLICATIONS

Bower, et al. "Low temperature Si3N4 direct bonding." Applied Physics Letters 62, 3485 (1993); doi: 10.1063/1.109002. Jun. 28, 1993.

Non-Final Office Action dated Nov. 19, 2018 in connection with U.S. Appl. No. 15/194,631.

Non-Final Office Action dated Jul. 12, 2019 in connection with U.S. Appl. No. 15/194,631.

Non-Final Office Action dated Nov. 19, 2018 for U.S. Appl. No. 15/194,631.

Notice of Allowance dated Jul. 12, 2019 for U.S. Appl. No. 15/194,631.

* cited by examiner

PATTERN TRANSFER TECHNIQUE AND METHOD OF MANUFACTURING THE SAME

REFERENCE TO RELATED APPLICATIONS

This Application is a Continuation of U.S. application Ser. No. 15/194,631, filed Jun. 28, 2016. The contents of the above-referenced Applications are hereby incorporated by reference in their entirety.

BACKGROUND

During the manufacture of integrated circuits (ICs), multi-step sequences of semiconductor manufacturing processes are performed to gradually form electronic circuits on semiconductor workpieces. One such semiconductor manufacturing process is lithography. Lithography is a process for transferring a geometric pattern to semiconductor workpieces. Lithography may be performed by, for example, photolithography, charged particle lithography, or nanoimprint lithography.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
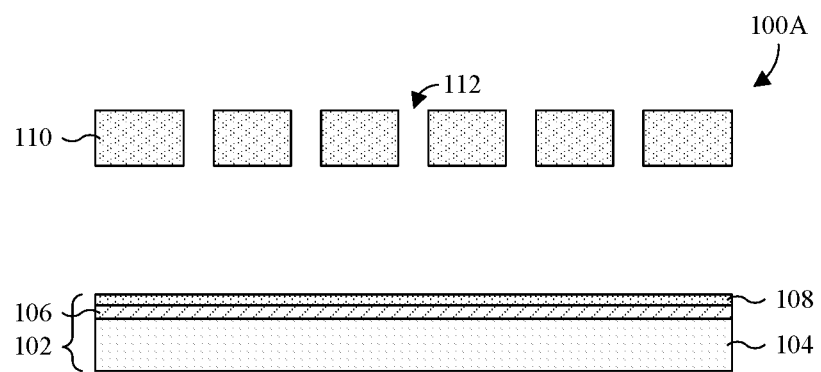
FIGS. 1A, 1B, 2-7, 8A, and 8B illustrate a series of cross-sectional and perspective views of some embodiments of a photo-free lithography process.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Photolithography is commonly used to fabricate geometric patterns on semiconductor workpieces. A photolithography process comprises depositing a photoresist layer over a semiconductor workpiece. Thereafter, radiation is selectively passed through a photomask to impart a pattern of the photomask on the radiation. Further, the photoresist layer is exposed to the radiation to chemically change exposed regions of the photoresist layer. With the photoresist layer exposed, a developer is applied to the photoresist layer to remove either exposed or unexposed regions of the photoresist layer and to develop the pattern in the photoresist layer. However, such kind of photolithography relies on a complicated photomask, and thus incurs high cost and low throughput.

An alternative to photolithography that has low cost and high throughput is nanoimprint lithography. A nanoimprint lithography process comprises depositing an imprint resist layer over a semiconductor workpiece and pressing a stamp into the imprint resist layer. The stamp has a pattern arranged along a bottom thereof, such that pressing the stamp into the imprint resist layer imprints the imprint resist layer with the pattern. With the imprint resist layer imprinted, the imprint resist layer is cured or hardened by, for example, exposure to ultraviolet radiation. Further, the stamp is removed from the imprint resist layer, thereby leaving the pattern in the imprint resist layer. However, nanoimprint lithography has contamination issues, since imprint resist may remain on the stamp. This, in turn, may reduce reliability by, for example, degrading the pattern, reducing yield, or damaging the stamp.

The present application is directed towards a photo-free lithography process. In some embodiments, a template mask is bonded to a production workpiece and comprises a plurality of openings defining a pattern. An etch is performed into the production workpiece, through the plurality of openings, to transfer the pattern of the template mask to the production workpiece. The template mask is de-bonded from the production workpiece. Advantageously, the photo-free lithography process is performed without depositing photoresist, exposing the photoresist to radiation, or developing the photoresist, such that cost is low and throughput is high compared to photolithography. Further, the photo-free lithography process is performed without imprint resist, such that reliability is high compared to nanoimprint lithography.

With reference to FIGS. 1A, 1B, 2-7, 8A, and 8B, a series of cross-sectional and perspective views 100A, 100B, 200-700, 800A, 800B illustrate some embodiments of a photo-free lithography process.

As illustrated by the cross-sectional views 100A of FIG. 1A, a production workpiece 102 is provided or otherwise formed. The production workpiece 102 comprises a substrate 104 upon which a target layer 106 and a hard mask layer 108 are stacked. In some embodiments, the substrate 104 comprises a semiconductor substrate (not shown). The semiconductor substrate may be, for example, a bulk silicon substrate, such as a bulk substrate of monocrystalline silicon, a silicon-on-insulator (SOI) substrate, or some other type of semiconductor substrate. Further, in some embodiments, the substrate 104 comprises additional layers (not shown) and/or electronic devices (not shown) stacked or otherwise arranged over the semiconductor substrate. The target layer 106 covers the substrate 104 and may be, for example, an oxide, such as silicon dioxide, or some other dielectric. The hard mask layer 108 covers the target layer 106 and may be, for example, a nitride, such as silicon nitride, or some other dielectric.

In some embodiments, the process for forming the production workpiece 102 comprises depositing or growing the target layer 106 over the substrate 104, followed by depositing or growing the hard mask layer 108 over the target layer 106. The target layer 106 and the hard mask layer 108 may be deposited or grown by, for example, vapor deposition, spin coating, atomic layer deposition (ALD), thermal oxidation, some other deposition or growth process, or a combination of the foregoing. The vapor deposition may include, for example, chemical vapor deposition (CVD), physical vapor deposition (PVD), some other vapor deposition process, or a combination of the foregoing.

Also illustrated by the cross-sectional view 100A of FIG. 1A, a template mask 110 is provided or otherwise formed, and is arranged over the production workpiece 102. The template mask 110 comprises a plurality of openings 112 that extend through the template mask 110, from a top surface of the template mask 110 to a bottom surface of the template mask 110, and that are arranged to define a pattern to be transferred to the target layer 106. The pattern may, for example, correspond to that of a photomask in a photomask set for a tape-out of an integrated circuit (IC). The tape-out is the final result of the design cycle for the IC. The template mask 110 may be, for example, a bulk silicon substrate, such as a bulk substrate of monocrystalline silicon, or some other semiconductor substrate.

In some embodiments, the openings 112 correspond to vias in a via layer of a back-end-of-line (BEOL) interconnect structure under manufacture. In such embodiments, the substrate 104 may comprise, for example, the semiconductor substrate and a partially formed BEOL interconnect structure overlying the semiconductor substrate. Further, in such embodiments, the target layer 106 may correspond to an interlayer dielectric (ILD) layer. The ILD layer may be, for example, silicon dioxide or a low κ dielectric. A low κ dielectric is a dielectric with a dielectric κ that is less than about 3.9.

Figure 1B:
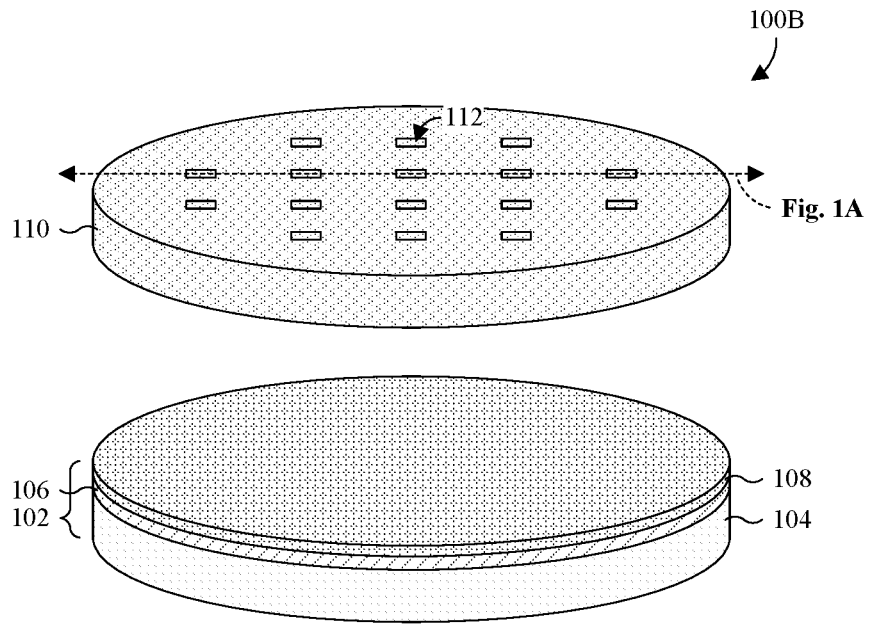

As illustrated by the perspective view 100B of FIG. 1B, in some embodiments, the production workpiece 102 and the template mask 110 are or otherwise comprise wafers. For example, the production workpiece 102 and the template mask 110 may each comprise 450 millimeter wafers of silicon.

Figure 2:
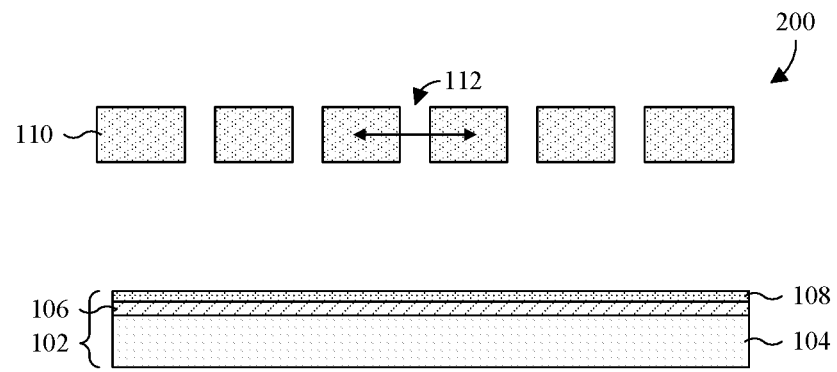

As illustrated by the cross-sectional view 200 of FIG. 2, the template mask 110 is aligned to the production workpiece 102. While discussed in greater detail hereafter (see, e.g., FIGS. 11A and 11B), in some embodiments, the process for aligning the template mask 110 comprises measuring alignment between alignment marks on the template mask 110 and the production workpiece 102 using, for example, Moiré interferometry. Further, in some embodiments, the process comprises laterally shifting and/or selectively heating the template mask 110 and/or the production workpiece 102 based on the measurements to align the alignment marks. The selective heating causes select regions of the template mask 110 and/or the production workpiece 102 to expand, thereby moving the alignment marks into alignment.

Figure 3:
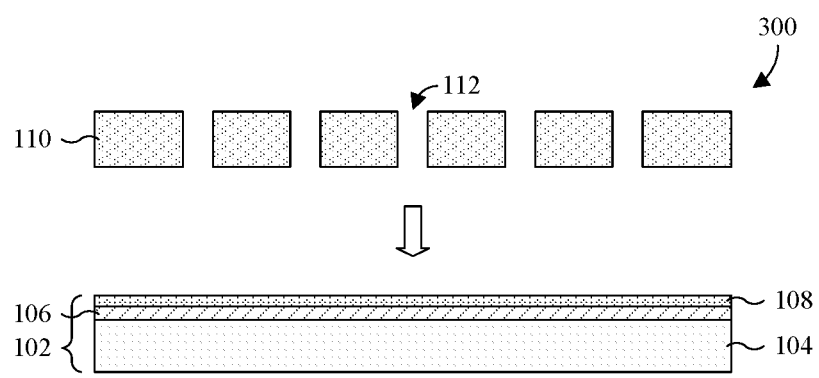

As illustrated by the cross-sectional view 300 of FIG. 3, the template mask 110 is bonded to the production workpiece 102 through the target layer 106 and the hard mask layer 108. In some embodiments, the template mask 110 is direct or fusion bonded to the production workpiece 102. For example, a hydrophilic fusion bonding process may be performed to bond the template mask 110 to the production workpiece 102.

In some embodiments, the process for bonding the template mask 110 to the production workpiece 102 comprises treating surfaces of the production workpiece 102 and the template mask 110 that are to be bonded together. The treating may comprise, for example, annealing the production workpiece 102 and/or the template mask 110 in the presence of nitrogen and/or hydrogen gas, and/or applying argon-based plasma to at least one of the surfaces. Further, in some embodiments, the process comprises cleaning the surfaces, pressing the surfaces together, and annealing. The cleaning may comprise, for example, rinsing the surfaces with water, such as deionized water. The annealing may comprise, for example, heating an environment of the production workpiece 102 and/or the template mask 110 to a low temperature, such as a temperature between about 200-300 degrees Celsius.

Figure 4:
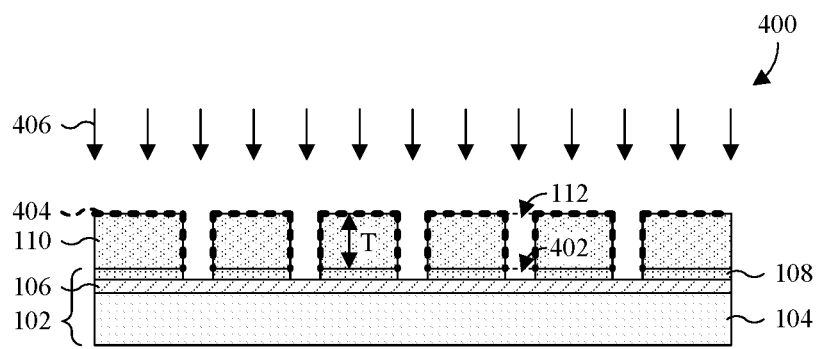

As illustrated by the cross-sectional view 400 of FIG. 4, a first etch is performed through the hard mask layer 108, with the template mask 110 in place, to transfer the pattern of the template mask 110 to the hard mask layer 108. As with the pattern of the template mask 110, the transferred pattern of the hard mask layer 108 is defined by an arrangement of openings 402 that extend through the hard mask layer 108, from a top surface of the hard mask layer 108 to a bottom surface of the hard mask layer 108. The first etch may stop, for example, on the target layer 106, such that the target layer 106 serves as an etch stop for the first etch. Further, the first etch may result, for example, in a residue 404 along surfaces of the production workpiece 102 and/or the template mask 110 that are exposed.

In some embodiments, the first etch is performed by plasma-based etching. For example, the first etch may be performed by application of chemically reactive plasma to the hard mask layer 108 through the template mask 110. As another example, the first etch may be performed by bombarding the hard mask layer 108 with plasma particles 406 through the template mask 110. In some embodiments, the template mask 110 facilitates highly anisotropic etching by a thickness T that is sufficient to collimate the plasma particles 406 before the plasma particles 406 bombard the hard mask layer 108.

Figure 5:
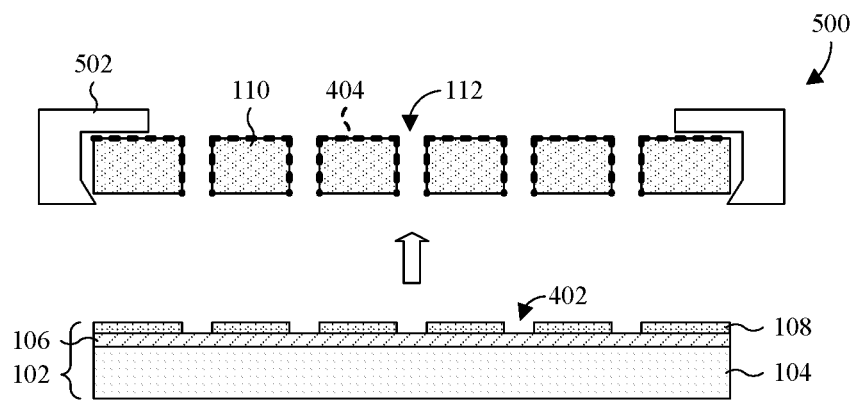

As illustrated by the cross-sectional view 500 of FIG. 5, the template mask 110 is de-bonded from the production workpiece 102. In some embodiments, the process for de-bonding the template mask 110 from the production workpiece 102 comprises pulling the template mask 110 and the production workpiece 102 apart with sufficient force to break the bond between the template mask 110 and the production workpiece 102. The mechanical force may, for example, be applied by a wafer handling tool 502.

Figure 6:
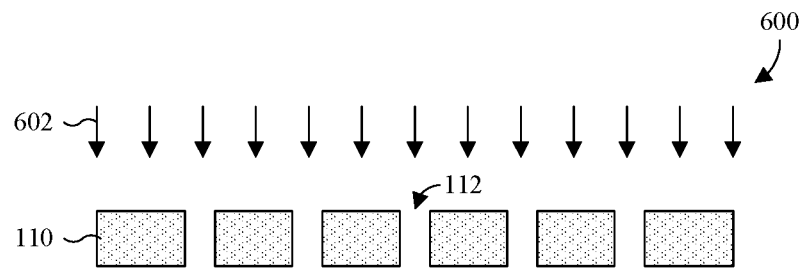

As illustrated by the cross-sectional view 600 of FIG. 6, the template mask 110 is cleaned and inspected for defects. In some embodiments, the cleaning removes the residue 404 (see FIG. 5) along surfaces of the template mask 110, and/or is performed by applying solvent 602 to the template mask 110. The solvent 602 may be, for example, a diluted ammonium peroxide mixture and/or a diluted mixture of sulfuric acid and of hydrogen peroxide. Further, in some embodiments, the inspection seeks to identify defects and/or damage to the template mask 110. To the extent that the template mask 110 is free of defects and/or damage, the template mask 110 may be used to pattern another production workpiece.

Figure 7:
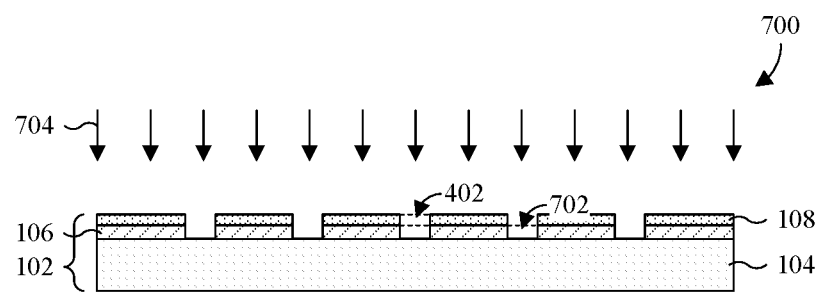

As illustrated by the cross-sectional view 700 of FIG. 7, a second etch is performed partially into or through the target layer 106, with the hard mask layer 108 in place, to transfer the pattern of the hard mask layer 108 and the template mask 110 to the target layer 106. Further, the second etch may stop, for example, on the substrate 104. As with the pattern of the hard mask layer 108, the transferred pattern of the target layer 106 is defined by an arrangement of openings 702 that extend partially into or through the target layer 106, from a top surface of the target layer 106 to or towards a bottom surface of the target layer 106.

In some embodiments, the second etch is performed by applying an etchant 704 to the target layer 106 through the hard mask layer 108. For example, the second etch may be performed by application of chemically reactive plasma to the target layer 106 through the hard mask layer 108. As another example, the second etch may be performed by bombarding the target layer 106 with plasma particles through the hard mask layer 108. As yet another example, the second etch may be performed by applying a chemically reactive solution to the target layer 106 through the hard mask layer 108.

Figure 8A:
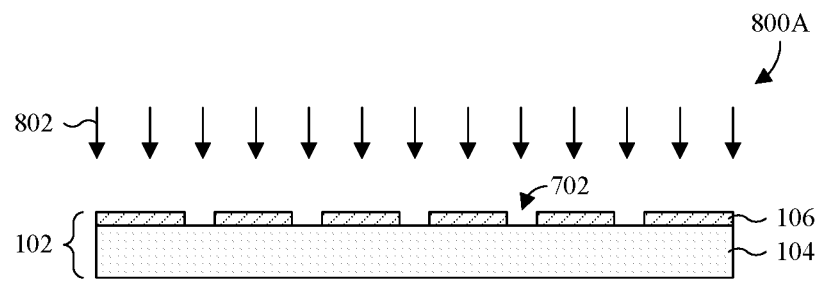
Figure 8B:
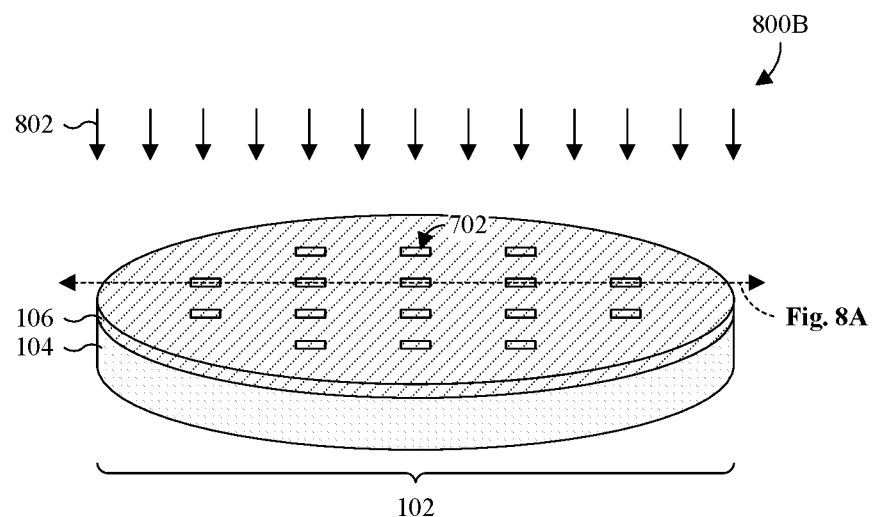

As illustrated by the cross-sectional view 800A of FIG. 8A and the perspective view 800B of FIG. 8B, in some embodiments, the hard mask layer 108 (See FIG. 7) is removed. The hard mask layer 108 may, for example, be removed by applying an etchant 802 to the hard mask layer 108 until the hard mask layer 108 is removed. The etchant 802 may be, for example, a wet or dry etchant, and/or may be, for example, highly selective of the hard mask layer 108 relative to the target layer 106 and one or more additional layers of the substrate 104 that are exposed and that underlie the hard mask layer 108.

In some embodiments, after transferring the pattern of the hard mask layer 108 to the target layer 106 and, in some embodiments, removing the hard mask layer 108, the foregoing process is repeated with the production workpiece 102 and another target mask with a different pattern. For example, a new target layer may be deposited or otherwise grown over the target layer 106, and the foregoing process may be used to pattern the new target layer with the other target mask. Such repetition may repeat, for example, until manufacture of one or more ICs on the production workpiece 102 is complete. Further, in some embodiments, the hard mask layer 108 (see, e.g., FIG. 1A) is omitted, such that the pattern of the template mask 110 (see, e.g., FIG. 1A) is transferred directly from the template mask 110 to the target layer 106.

Figure 9:
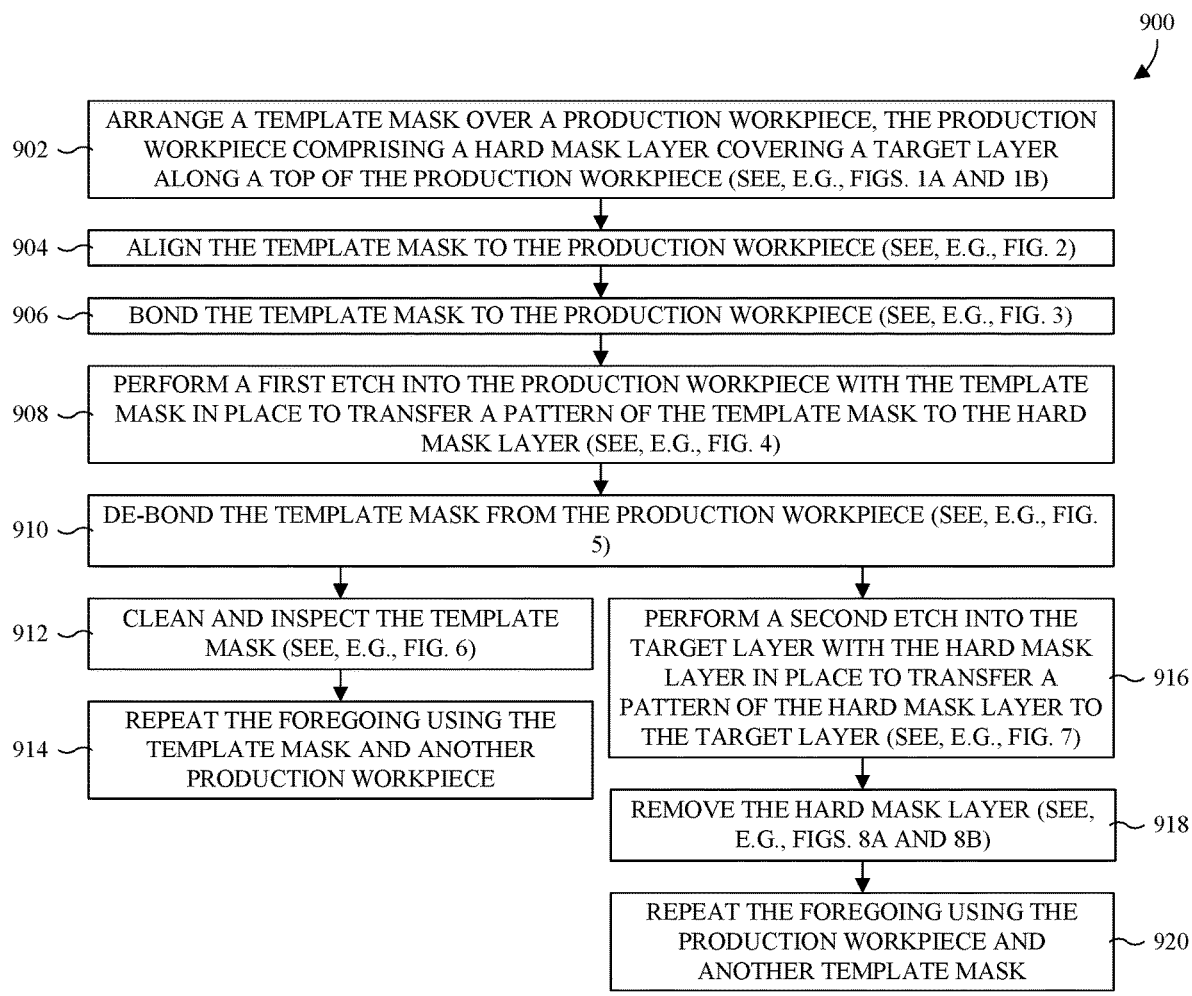
FIG. 9 illustrates a flowchart of some embodiments of the photo-free lithography process of FIGS. 1A, 1B, 2-7, 8A, and 8B.

With reference to FIG. 9, a flowchart 900 of some embodiments of the photo-free lithography process of FIGS. 1A, 1B, 2-7, 8A, and 8B is provided.

At 902, a template mask is arranged over a production workpiece. The production workpiece comprises a hard mask layer covering a target layer along a top of the production workpiece. See, for example, FIGS. 1A and 1B. In some embodiments, the template mask is part of a template mask set representing a photomask set of an IC tape-out. For example, each template mask of the template mask set corresponds to one of the photomasks in the photomask set and has a pattern of openings arranged according to a pattern of the corresponding photomask. The correspondence may be, for example, one to one.

At 904, the template mask is aligned to the production workpiece. See, for example, FIG. 2.

At 906, the template mask is bonded to the production workpiece. See, for example, FIG. 3. The template mask may, for example, be bonded by fusion bonding.

At 908, a first etch is performed into the production workpiece with the template mask in place to transfer a pattern of the template mask to the hard mask layer. See, for example, FIG. 4.

At 910, the template mask is de-bonded from the production workpiece. See, for example, FIG. 5.

At 912, the template mask is cleaned and inspected. See, for example, FIG. 6.

At 914, the foregoing (902-912) is repeated using the template mask and another production workpiece. In some embodiments, the other production workpiece is the same as the production workpiece before the photo-free lithography process.

At 916, a second etch is performed into the target layer with the hard mask layer in place to transfer a pattern of the hard mask layer to the target layer. See, for example, FIG. 7.

At 918, the hard mask layer is removed by, for example, a third etch. See, for example, FIGS. 8A and 8B.

At 920, the foregoing (902-912) is repeated using the production workpiece and another template mask. In some embodiments, the other template mask is next in the template mask set for the production workpiece.

Advantageously, using the template mask to pattern the target layer results in low cost, high throughput, and high reliability at least relative to photolithography and nanoimprint lithography. The photo-free lithography process is performed without depositing photoresist, exposing the photoresist to radiation, or developing the photoresist, such that cost is low and throughput is high compared to photolithography. Further, the photo-free lithography process is performed without imprint resist, such that reliability is high compared to nanoimprint lithography. As discussed above, the imprint resist can stick to a stamp used in nanoimprint lithography to degrade a pattern of the stamp, reduce yield, or damage the stamp.

While the method described by the flowchart 900 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases. For example, the hard mask layer may be omitted, such that 908 transfers the pattern of the template mask directly to the target layer and 916 and 918 are omitted.

Figure 10:
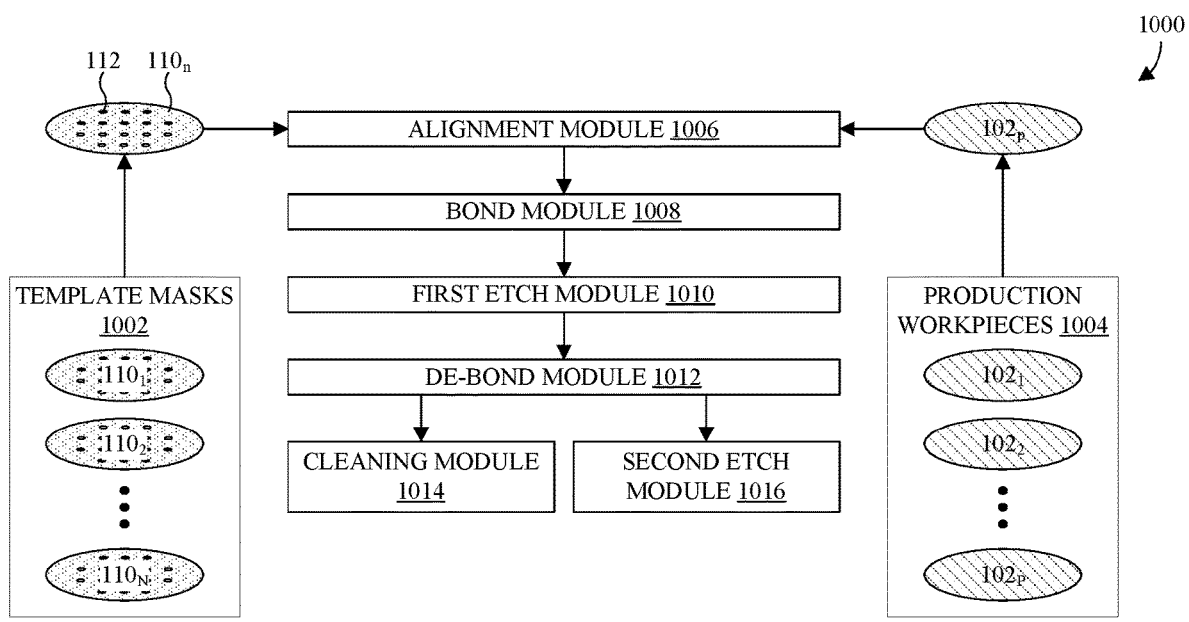
FIG. 10 illustrates a flowchart of some embodiments of a system for performing a photo-free lithography process.

With reference to FIG. 10, a flowchart 1000 of some embodiments of a system for performing a photo-free lithography process is provided. The system may, for example, be configured to perform the photo-free lithography process of FIGS. 1A, 1B, 2-7, 8A, and 8B and/or the photo-lithography process of FIG. 9. As illustrated, the system comprises a template mask set 1002 and a production workpiece set 1004.

The template mask set 1002 comprises N template masks $110_1$, $110_2$, $110_N$ arranged in a sequence spanning from 1 to N. N may be, for example, one or more, such as 80. Each of the N template masks $110_1$, $110_2$, $110_N$ has a plurality of openings 112 that extend through the template mask $110_1$, $110_2$, $110_N$, from a top surface of the template mask $110_1$, $110_2$, $110_N$ to a bottom surface of the template mask $110_1$, $110_2$, $110_N$, and that are arranged in a pattern. The patterns of the N template masks $110_1$, $110_2$, $110_N$ may, for example, be different. Further, each of the N template masks $110_1$, $110_2$, $110_N$ may be, for example, a bulk silicon substrate, such as a bulk substrate of monocrystalline silicon, or some other semiconductor substrate. An example of a template mask may be seen, for example, in FIGS. 1A and 1B.

In some embodiments, the N template masks $110_1$, $110_2$, $110_N$ correspond to the photomasks in a photomask set of an IC tape-out, such that the pattern of each template mask $110_1$, $110_2$, $110_N$ is that of the corresponding photomask. The correspondence between the N template masks $110_1$, $110_2$, $110_N$ and the photomasks may be, for example, one to one. Further, in some embodiments, the N template masks $110_1$, $110_2$, $110_N$ correspond to different layers in the IC tape-out, such that the pattern of each template mask $110_1$, $110_2$, $110_N$ is that of a pattern to be transferred to the corresponding layer. The correspondence between the N template masks $110_1$, $110_2$, $110_N$ and the layers may be, for example, one to one. The layers may, for example, correspond to interconnect layers within a BEOL interconnect structure, such as interconnect layers of vias and interconnect layers of metal lines.

The production workpiece set 1004 comprises P production workpieces $102_1$, $102_2$, $102_P$. P may be, for example, one or more. Each of the P production workpieces $102_1$, $102_2$, $102_P$ is either unprocessed by the template masks $110_1$, $110_2$, $110_N$ or has been processed up to one of the N template masks $110_1$, $110_2$, $110_N$ in the sequence of the template mask set 1002. In some embodiments, each of the P production workpieces $102_1$, $102_2$, $102_P$ comprises a semiconductor substrate. Further, in some embodiments, each of the P production workpieces $102_1$, $102_2$, $102_P$ comprises one or more layers and/or electronics devices stacked or otherwise arranged thereover. An example of a production workpiece may be seen, for example, in FIGS. 1A and 1B.

An alignment module 1006 receives a production workpiece $102_p$ from the production workpiece set 1004, and also a template mask $110_n$ from the template mask set 1002. The production workpiece $102_p$ corresponds to the pth element in the production workpiece set 1004, and the template mask $110_n$ corresponds to the nth element in the template mask set 1002. Further, n is dependent upon the extent to which the production workpiece $102_p$ has been processed by the template mask set 1002. When the production workpiece $102_p$ is unprocessed by the template mask set 1002, the template mask $110_n$ is first in the sequence of the template mask set 1002. Otherwise, the template mask $110_n$ is next in the sequence of the template mask set 1002 for the production workpiece $102_p$. In other words, the production workpiece $102_p$ is processed up to the n–1 element in the template mask set 1002.

After receiving the template mask $110_n$ and the production workpiece $102_p$, the alignment module 1006 aligns the template mask $110_n$ to the production workpiece $102_p$, over the production workpiece $102_p$, and a bond module 1008 subsequently bonds the production workpiece $102_p$ to the template mask $110_n$. The alignment module 1006 may, for example, align the production workpiece $102_p$ to the template mask $110_n$ using interferometry, such as Moiré interferometry. The bond module 1008 may, for example, bond the production workpiece $102_p$ and the template mask $110_n$ together using a fusion bonding process, such as a hydrophilic fusion bonding process. Examples of alignment and bonding are respectively shown in FIGS. 2 and 3. Further, in some embodiments, the alignment module 1006 and the bond module 1008 are integrated together into a common process tool.

In some embodiments, the alignment module 1006 comprises an interferometry camera to measure alignment between alignment marks on the template mask $110_n$ and the production workpiece $102_p$. Further, in some embodiments, the alignment module 1006 comprises one or more systems or devices for bringing the template mask $110_n$ and the production workpiece $102_p$ into alignment based on the measurements. For example, the alignment module 1006 may comprise one or more mechanical devices, such as a mechanical arm, to move the template mask $110_n$ laterally into alignment with the production workpiece $102_p$, and/or to move the production workpiece $102_p$ laterally into alignment with the template mask $110_n$. As another example, the alignment module 1006 may comprise a heating system to selectively heat regions of the production workpiece $102_p$ and/or the template mask $110_n$, while not heating other regions of the production workpiece $102_p$ and/or the template mask $110_n$, to expand the heated regions into alignment. The heating system may comprise, for example, a heat source, one or more digital mirror arrays, and a collimator.

In some embodiments, the bond module 1008 comprises a process chamber accommodating a lower plate and an upper plate. The lower plate supports one of the production workpiece $102_p$ and the template mask $110_n$, and may be configured to apply heat. The upper plate supports the other one of the production workpiece $102_p$ and the template mask $110_n$, and is arranged at the end of a vertical column configured to press the upper plate against the lower plate. Further, the upper plate may be configured to apply heat. To the extent that the alignment module 1006 and the bond module 1008 are integrated, the alignment module 1006 is at least partially arranged within the process chamber of the bond module 1008. For example, the interferometry camera and/or a digital mirror array may be arranged within the process chamber.

After aligning and bonding the production workpiece $102_p$ and the template mask $110_n$ together, a first etch module 1010 performs a first etch into the production workpiece $102_p$, through the template mask $110_n$, to transfer a pattern of the template mask $110_n$ to the production workpiece $102_p$. In some embodiments, the pattern is transferred to a hard mask layer of the production workpiece $102_p$, which is subsequently used to transfer the pattern to an underlying target layer of the production workpiece $102_p$. An example is illustrated in, for example, FIG. 4. In other embodiments, the pattern is transferred directly the target layer without an intervening hard mask layer. The first etch module 1010 may be, for example, a plasma etch process tool.

Further, a de-bond module 1012 subsequently de-bonds the template mask $110_n$ from the production workpiece $102_p$. In some embodiments, the de-bond module 1012 comprises a mechanical system or device, such as a mechanical arm, that is configured to pull the template mask $110_n$ away from the production workpiece $102_p$ with sufficient force to break the bond therebetween. An example is illustrated in, for example, FIG. 5.

In some embodiments, the first etch leaves etch residue on the template mask $110_n$, which may degrade the pattern of the template mask $110_n$ and/or damage the template mask $110_n$. Therefore, a cleaning module 1014 may clean the template mask $110_n$ after the first etch. In some embodiments, the cleaning is performed by applying a diluted ammonium peroxide mixture and/or a diluted mixture of sulfuric acid and hydrogen peroxide to the template mask $110_n$. An example is illustrated in, for example, FIG. 6. The cleaning module 1014 may be, for example, a wet or dry cleaning process tool.

After cleaning the template mask $110_n$, or otherwise de-bonding the template mask $110_n$, the system may use the template mask $110_n$ to process another production workpiece from the production workpiece set 1004. To the extent that the template mask $110_n$ is first in the template mask set 1002, the other production workpiece is unprocessed by the template mask set 1002. Otherwise, the other production workpiece is processed up to the n−1 element in the template mask set 1002. This may, for example, continue until all production workpieces $102_1$, $102_2$, $102_p$ in the production workpiece set 1004 are processed by the template mask $110_n$.

In some embodiments, the first etch transfers the pattern of the template mask $110_n$ to a hard mask layer, such that a second etch module 1016 performs a second etch into a target layer underlying the hard mask layer, through the hard mask layer, to transfer a pattern of the hard mask layer to the target layer. An example is illustrated in, for example, FIG. 7. Further, in some embodiments, the second etch module 1016 performs a third etch into the hard mask layer to remove the hard mask layer from over the target layer. An example is illustrated in, for example, FIGS. 8A and 8B. The second etch module 1016 may be, for example, a plasma etch process tool, and/or may be, for example, the same as the first etch module 1010.

After performing the second and/or third etch, or otherwise de-bonding the production workpiece $102_p$, the system may use the production workpiece $102_p$ with the next template mask in the template mask set 1002 for the production workpiece $102_p$. For example, n may be incremented by one and/or a new target layer may be deposited or otherwise grown over the production workpiece $102_p$. This may, for example, continue until the production workpiece $102_p$ has been processed by all template masks $110_1$, $110_2$, $110_N$ in the template mask set 1002.

Figure 11A:
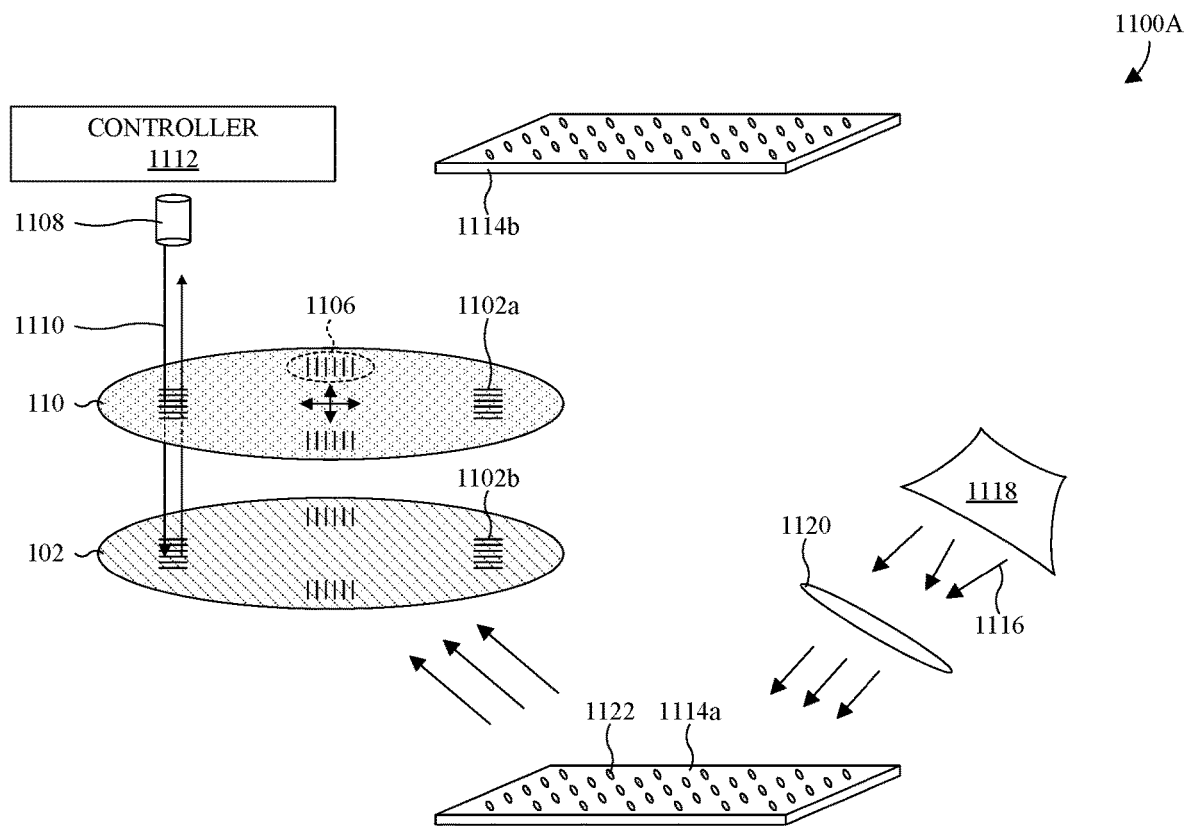
FIG. 11A illustrates a block diagram of some embodiments of an alignment module within the system of FIG. 10.

With reference to FIG. 11A, a block diagram 1100A of some embodiments of the alignment module 1006 of FIG. 10 is provided. As illustrated, a template mask 110 is arranged over a production workpiece 102. The template mask 110 has a first pattern of alignment marks 1102a arranged thereon, and the production workpiece 102 has a second pattern of alignment marks 1102b that is arranged thereon and that is the same as the first pattern. In some embodiments, first and second patterns each comprise multiple alignment mark sets 1106, such as, for example, an alignment mark set comprising a plurality of parallel lines.

An interferometry camera 1108 measures alignment between the first pattern and the second pattern using, for example, Moiré interferometry and the superimposition of electromagnetic waves 1110 reflecting off the alignment marks 1102a, 1102b. Based on the one or more measurements, an overlay error between the template mask 110 and the production workpiece 102 is calculated and used to adjust the relative positioning of the production workpiece 102 and the template mask 110. For example, the template mask 110 may be moved laterally to compensate for the overlay error. The calculation may, for example, be performed by a controller 1112 controlling the alignment. The controller 1112 may, for example, be a microcontroller, an electronic processor, or some other electronic device programmed or configured to perform the alignment.

In some embodiments, after compensating for overlay error, fine alignment may be performed to compensate for residual error. The fine alignment may, for example, always be performed or may, for example, only be performed when the residual error exceeds a predetermined threshold. Further, the residual error may include, for example, run-out error between the template mask 110 and the production workpiece 102. The fine alignment is controlled by the controller 1112 and, in some embodiments, comprises exposing one or more digital mirror arrays 1114a, 1114b to radiation 1116 from a heat source 1118, and subsequently reflecting the radiation 1116 off the one or more digital mirror arrays 1114a, 1114b towards the production workpiece 102 and/or template mask 110. The radiation 1116 may, for example, be ultraviolet (UV) radiation or vacuum UV (VUV), and/or may, for example, be collimated by, for example, a lens 1120 before impinging on the one or more digital mirror arrays 1114a, 1114b.

The one or more digital mirror arrays 1114a, 1114b are configured to reflect the radiation 1116 and are each defined by a plurality of individual mirrors 1122. The individual mirrors 1122 may be, for example, individually controllable and/or movable. Further, the one or more digital mirror arrays 1114a, 1114b comprise a lower digital mirror array 1114a arranged under the production workpiece 102 and/or an upper digital mirror array 1114b arranged over the template mask 110. In operation, the one or more digital mirror arrays 1114a, 1114b selectively heat regions of the production workpiece 102 and/or the template mask 110, while not heating other regions of the production workpiece 102 and/or the template mask 110, to expand the heated regions and to bring the first pattern of alignment marks 1102a into alignment with the second pattern of alignment 1102b. The one or more digital mirror arrays 1114a, 1114b may, for example, be controlled based on feedback from the interferometry camera 1108.

Figure 11B:
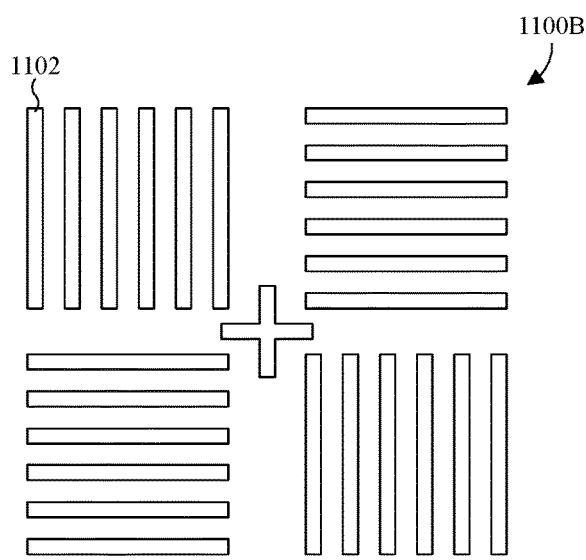
FIG. 11B illustrates a layout view of some embodiments of an alignment mark set for use by the alignment module of FIG. 11A.

With reference to FIG. 11B, a layout view 1100B of some embodiments of an individual one of the alignment mark sets 1106 of FIG. 11A is provided. The layout view 1100B may, for example, be representative of each of the alignment mark sets 1106. As illustrated, the alignment mark set comprises multiple alignment marks $110_2$. The multiple alignment marks $110_2$ comprise a plus-shaped alignment mark around which four groups of line-shaped alignment marks are arranged, and each group of line-shaped alignment marks comprises multiple line-shaped alignment marks arranged in parallel.

In view of the foregoing, in some embodiments, the present disclosure provides a lithography process. A template mask is bonded to a production workpiece and comprises a plurality of openings defining a pattern. An etch is performed into the production workpiece, through the plurality of openings, to transfer the pattern of the template mask to the production workpiece. The template mask is de-bonded from the production workpiece.

In other embodiments, the present disclosure provides a system for performing a lithography process. A template mask comprises a plurality of openings that define a pattern and that extend through the template mask. A bond module is configured to bond a bottom surface of the template mask to a top surface of a production workpiece. An etch module is configured to perform an etch into the production workpiece, through the plurality of openings, to transfer the pattern to the production workpiece. A de-bond module is configured to de-bond the template mask from the production workpiece.

In yet other embodiments, the present disclosure provides another lithography process. A template mask is provided that comprises a plurality of openings extending through the template mask and arranged in a pattern. A production workpiece is provided that comprises a hard mask layer and a target layer stacked along a top surface of the production workpiece. A bottom surface of the template mask is directly bonded to the top surface of the production workpiece by fusion bonding. A first etch is performed into the hard mask layer, through the template mask, to transfer the pattern of the template mask to the hard mask layer. The first etch stops on the target layer and is a dry etch. The template mask is de-bonded from the production workpiece. A second etch is performed into the target layer, through the hard mask layer, to transfer the pattern of the template mask from the hard mask layer to the target layer. A third etch is performed into the hard mask layer to remove the hard mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography process comprising:
   bonding a template mask to a production workpiece, wherein the template mask comprises a plurality of openings defining a pattern, wherein the bonding comprises wetting a workpiece surface of the production workpiece and/or a mask surface of the template mask, pressing the workpiece and mask surfaces into direct contact, and annealing the template mask and the production workpiece while the workpiece and mask surfaces are in direct contact;
   exposing the production workpiece to plasma, through the plurality of openings, wherein the exposing is performed after the bonding is completed; and
   de-bonding the template mask from the production workpiece.

2. The lithography process according to claim 1, wherein the exposing transfers the pattern of the template mask to the production workpiece.

3. The lithography process according to claim 2, wherein the production workpiece comprises a substrate and a layer overlying the substrate, and wherein the exposing transfers the pattern to the layer.

4. The lithography process according to claim 1, wherein the bonding comprises exposing the mask surface and/or the workpiece surface to argon-based plasma before pressing the workpiece and mask surfaces into direct contact.

5. The lithography process according to claim 1, wherein the bonding comprises annealing the mask surface and/or the workpiece surface in the presence of nitrogen and hydrogen gas before pressing the workpiece and mask surfaces into direct contact.

6. The lithography process according to claim 1, further comprising:
   measuring alignment between the workpiece and mask surfaces using interferometry; and
   aligning the workpiece surface to the mask surface before the bonding and based on the measuring, wherein the measuring, the aligning, and the bonding are performed within a common process chamber.

7. The lithography process according to claim 6, wherein the aligning comprises:
   coarsely aligning the workpiece surface to the mask surface by laterally moving the workpiece surface and/or the mask surface based on the measuring; and
   finely aligning the workpiece surface to the mask surface by selectively heating the template mask or the production workpiece with a digital mirror array based on the measuring.

8. A lithography process comprising:
   bonding a template wafer to a first production workpiece, wherein the template wafer comprises a plurality of openings defining a pattern, and wherein the bonding comprises exposing a bottom surface of the template wafer and/or a top surface of the first production workpiece to plasma and pressing the bottom surface of the template wafer and the top surface of the first production workpiece into direct contact after the exposing;
   performing a first etch into the first production workpiece, through the plurality of openings, to transfer the pattern of the template wafer to the first production workpiece, wherein the first etch is performed after the bonding is completed; and
   de-bonding the template wafer from the first production workpiece.

9. The lithography process according to claim 8, wherein the bonding further comprises annealing the template wafer and the first production workpiece while the bottom surface of the template wafer and the top surface of the first production workpiece are in direct contact.

10. The lithography process according to claim 8, wherein the bonding further comprises annealing the template wafer and/or the first production workpiece in the presence of nitrogen gas and/or hydrogen gas before the bottom surface of the template wafer and the top surface of the first production workpiece are in direct contact.

11. The lithography process according to claim 8, wherein the bonding further comprises wetting the bottom surface of the template wafer and the top surface of the first production workpiece before pressing the bottom surface of the template wafer and the top surface of the first production workpiece into direct contact.

12. The lithography process according to claim 8, wherein the template wafer is a bulk silicon substrate.

13. The lithography process according to claim 8, wherein the first production workpiece comprises a substrate and a layer overlying the substrate, and wherein the first etch transfers the pattern to the layer.

14. The lithography process according to claim 8, further comprising:
   bonding the template wafer to a second production workpiece by hydrophilic fusion bonding;
   performing a second etch into the second production workpiece, through the plurality of openings, to transfer the pattern of the template wafer to the second production workpiece, wherein the second etch is performed after the bonding of the template wafer to the second production workpiece is completed; and
   de-bonding the template wafer from the second production workpiece.

15. The lithography process according to claim 14, wherein the first etch results in etch residue on surfaces of the template wafer, and wherein the lithography process further comprises:

cleaning and inspecting the template wafer before the bonding of the template wafer to the second production workpiece.

16. A lithography process comprising:

aligning a template mask to a production workpiece using a first digital mirror array, wherein the first digital mirror array is configured to selectively reflect incident radiation towards one of the template mask and the production workpiece to heat some, but not all, portions thereof into alignment with corresponding portions of another of the template mask and the production workpiece;

annealing the template mask and the production workpiece, while a bottom surface of the template mask is in direct contact with a top surface of the production workpiece, to bond the template mask to the production workpiece;

performing an etch into the production workpiece, through a plurality of openings in the template mask, to transfer a pattern of the template mask to the production workpiece; and de-bonding the template mask from the production workpiece.

17. The lithography process according to claim 16, further comprising:

measuring alignment between the production workpiece and the template mask using interferometry, wherein the aligning is based on the measuring.

18. The lithography process according to claim 16, wherein the aligning additionally uses a second digital mirror array, and wherein the second digital mirror array is configured to selectively reflect incident radiation towards the other one of the template mask and the production workpiece to heat some, but not all, portions thereof into alignment with corresponding portions of the one of the template mask and the production workpiece.

19. The lithography process according to claim 16, wherein the first digital mirror array is elevated relative to the template mask and the production workpiece, and wherein the one of the template mask and the production workpiece is the template mask.

20. The lithography process according to claim 16, further comprising:

wetting the bottom surface of the template mask and/or the top surface of the production workpiece before the bottom surface of the template mask is in direct contact with the top surface of the production workpiece.

\* \* \* \* \*